US007475382B2

(12) United States Patent
Melvin, III et al.

(10) Patent No.: US 7,475,382 B2
(45) Date of Patent: Jan. 6, 2009

(54) METHOD AND APPARATUS FOR DETERMINING AN IMPROVED ASSIST FEATURE CONFIGURATION IN A MASK LAYOUT

(75) Inventors: Lawrence S. Melvin, III, Hillsboro, OR (US); Benjamin D. Painter, Tigard, OR (US)

(73) Assignee: Synopsys, Inc., Mountain View, CA (US)

( * ) Notice: Subject to any disclaimer, the term of this patent is extended or adjusted under 35 U.S.C. 154(b) by 510 days.

(21) Appl. No.: 11/109,534

(22) Filed: Apr. 19, 2005

(65) Prior Publication Data

US 2006/0188673 A1 Aug. 24, 2006

(51) Int. Cl.
*G06F 17/50* (2006.01)
(52) U.S. Cl. .............................. 716/21; 716/19; 716/20; 430/5; 703/2; 382/144; 382/145
(58) Field of Classification Search ............. 716/19–21; 430/5; 703/2; 382/144–145
See application file for complete search history.

(56) References Cited

U.S. PATENT DOCUMENTS

| | | | |
|---|---|---|---|
| 5,229,230 A | | 7/1993 | Kamon |
| 5,638,211 A | * | 6/1997 | Shiraishi ..................... 359/559 |
| 5,680,588 A | * | 10/1997 | Gortych et al. ................ 716/19 |
| 5,756,981 A | * | 5/1998 | Roustaei et al. ......... 235/462.42 |
| 6,396,158 B1 | * | 5/2002 | Travis et al. ................. 257/784 |
| 6,453,457 B1 | | 9/2002 | Pierrat et al. .................. 716/19 |
| 6,467,076 B1 | * | 10/2002 | Cobb ........................... 716/19 |
| 6,777,138 B2 | | 8/2004 | Pierrat et al. .................... 430/5 |
| 6,803,995 B2 | * | 10/2004 | Ausschnitt .................... 355/55 |
| 6,928,634 B2 | * | 8/2005 | Granik et al. .................. 716/19 |

(Continued)

FOREIGN PATENT DOCUMENTS

EP 0 307 726 3/1989

OTHER PUBLICATIONS

Publication: *Characterization of Assist Features on Impact of Mask Error Enhancement Factors for Sub-0.13um Technology*, Sia Kim Tan et al., 21st Annual BACUS Symposium on Photomask Technology, Dao & Grenon, Eds., Proceedings of SPIE, vol. 4562 (2002), pp. 1000-1007.

(Continued)

*Primary Examiner*—Thuan Do
*Assistant Examiner*—Naum B Levin
(74) *Attorney, Agent, or Firm*—Park, Vaughan & Fleming LLP

(57) ABSTRACT

One embodiment of the present invention provides a system that determines the locations and dimensions of one or more assist features in an uncorrected or corrected mask layout. During operation, the system receives a mask layout. The system then creates a set of candidate assist feature configurations, which specify locations and sizes for one or more assist features in the mask layout. Next, the system determines an improved assist feature configuration using the set of candidate assist feature configurations and a process-sensitivity model which can be represented by a multidimensional function that captures process-sensitivity information. Note that placing assist features in the mask layout based on the improved assist feature configuration improves the manufacturability of the mask layout. Moreover, using the process-sensitivity model to determine the improved assist feature configuration reduces the computational time required to determine the improved assist feature configuration in the mask layout.

12 Claims, 8 Drawing Sheets

U.S. PATENT DOCUMENTS

| | | | |
|---|---|---|---|
| 6,964,032 B2 * | 11/2005 | Liebmann et al. | 716/19 |
| 6,978,438 B1 * | 12/2005 | Capodieci | 716/21 |
| 7,003,758 B2 * | 2/2006 | Ye et al. | 716/21 |
| 7,013,439 B2 * | 3/2006 | Robles et al. | 716/4 |
| 7,047,505 B2 * | 5/2006 | Saxena et al. | 716/2 |
| 7,072,502 B2 * | 7/2006 | Hemar et al. | 382/144 |
| 7,073,162 B2 * | 7/2006 | Cobb et al. | 716/20 |
| 7,080,349 B1 * | 7/2006 | Babcock et al. | 716/19 |
| 7,147,976 B2 * | 12/2006 | Liebmann et al. | 430/5 |
| 7,155,689 B2 * | 12/2006 | Pierrat et al. | 716/4 |
| 7,207,029 B2 * | 4/2007 | Beale et al. | 716/21 |
| 7,233,887 B2 * | 6/2007 | Smith | 703/2 |
| 7,243,332 B2 * | 7/2007 | Melvin et al. | 716/21 |
| 7,251,807 B2 * | 7/2007 | Melvin et al. | 716/21 |
| 7,315,999 B2 * | 1/2008 | Melvin et al. | 716/20 |
| 2002/0091985 A1 * | 7/2002 | Liebmann et al. | 716/19 |
| 2002/0164065 A1 | 11/2002 | Cai et al. | 382/149 |
| 2003/0046654 A1 | 3/2003 | Bodendorf et al. | 716/19 |
| 2003/0121021 A1 | 6/2003 | Liu et al. | 716/19 |
| 2004/0111693 A1 | 6/2004 | Lin et al. | |
| 2004/0170905 A1 | 9/2004 | Liebmann et al. | |
| 2005/0037267 A1 | 2/2005 | Yamazoe et al. | 430/5 |
| 2005/0198598 A1 * | 9/2005 | Adam | 716/4 |
| 2005/0202321 A1 * | 9/2005 | Gordon et al. | 430/5 |
| 2005/0268256 A1 * | 12/2005 | Tsai et al. | 716/4 |
| 2006/0051682 A1 * | 3/2006 | Hess et al. | 430/5 |
| 2006/0190913 A1 * | 8/2006 | Melvin et al. | 716/19 |
| 2006/0212839 A1 * | 9/2006 | Melvin et al. | 716/21 |
| 2006/0236294 A1 * | 10/2006 | Saidin et al. | 716/19 |
| 2007/0011644 A1 * | 1/2007 | Abrams et al. | 716/19 |
| 2007/0038973 A1 * | 2/2007 | Li et al. | 716/21 |
| 2007/0183647 A1 * | 8/2007 | Allman et al. | 382/154 |

OTHER PUBLICATIONS

Publication: *Detailed Placement for Improved Depth of Focus and CD Control*, Puneet Gupta et al., 0-7803-8736-8/05, IEEE 2005, pp. 343-348.

* cited by examiner

METHOD AND APPARATUS FOR DETERMINING AN IMPROVED ASSIST FEATURE CONFIGURATION IN A MASK LAYOUT

RELATED APPLICATION

This application is related to U.S. Pat. No. 7,251,807, entitled, "METHOD AND APPARATUS FOR IDENTIFYING A MANUFACTURING PROBLEM AREA IN A LAYOUT USING A PROCESS-SENSITIVITY MODEL," by inventors Lawrence S. Melvin III and James P. Shiely filed on 24 Feb. 2005.

BACKGROUND

1. Field of the Invention

The present invention is related to semiconductor manufacturing. More specifically, the present invention is related to a method and apparatus for determining an improved assist feature configuration in a mask layout using a process-sensitivity model.

2. Related Art

The dramatic improvements in semiconductor integration densities in recent years have largely been made possible by corresponding improvements in semiconductor manufacturing technologies.

One such semiconductor manufacturing technology involves placing assist features in a mask layout. Note that assist features can be printing (e.g., super-resolution assist features) or non-printing (e.g., sub-resolution assist features). In either case, assist features are meant to improve the depth of focus of the patterns on the mask layout intended to be printed on the wafer.

Present techniques for placing assist features typically use design rules, which place and size assist features based on combinations of feature width and spacing parameters. Note that these techniques are not directed towards optimizing the assist feature length for improving depth of focus for 2D features.

Furthermore, rule-based approaches can result in missed or sub-optimal placement and/or dimensioning of assist features. Additionally, large and complex layouts can require a large number of design rules, which can be very difficult to manage. Moreover, design rules can be overly restrictive which can prevent designers from being able to achieve the best device performance.

In addition, design rule based techniques are typically geared towards improving manufacturability of 1-D regions of a pattern. As a result, rule-based techniques are usually not effective for improving the depth of focus of 2-D regions in a pattern.

Hence, what is needed is a method and apparatus for determining the locations and dimensions of assist features in a mask layout without the problems described above.

SUMMARY

One embodiment of the present invention provides a system that determines the locations and dimensions of one or more assist features in an uncorrected or corrected mask layout. During operation, the system receives a mask layout. The system then creates a set of candidate assist feature configurations, which specify locations and dimensions for one or more assist features in the mask layout. Next, the system determines an improved assist feature configuration using the set of candidate assist feature configurations and a process-sensitivity model which can be represented by a multidimensional function that captures process-sensitivity information. Note that placing assist features in the mask layout based on the improved assist feature configuration improves the manufacturability of the mask layout. Moreover, using the process-sensitivity model to determine the improved assist feature configuration reduces the computational time required to determine the improved assist feature configuration in the mask layout.

In a variation on this embodiment, the system determines the improved assist feature configuration by: selecting a set of evaluation points in the mask layout; computing process-variation values at the set of evaluation points for the set of candidate assist feature configurations; formulating an optimization problem based on the process-variation values, such that a solution to the optimization problem is associated with an assist feature configuration; computing a substantially optimal solution to the optimization problem; and determining the improved assist feature configuration based on the substantially optimal solution to the optimization problem. Note that the system can compute process-variation values by first placing representative assist features in the mask layout based on an assist feature configuration from the set of candidate assist feature configurations, and then evaluating process-variation values at the set of evaluation points by convolving the process-sensitivity model with a multidimensional function that represents the mask layout (which contains the representative assist features). Furthermore, in one embodiment, the objective function for the optimization problem is a linear combination of variables associated with the process-variation values at the evaluation points.

In a variation on this embodiment, the system can compute the process-sensitivity model by: creating an on-target process model that models a semiconductor manufacturing process under nominal process conditions; creating one or more off-target process models that model the semiconductor manufacturing process under one or more process conditions that are different from nominal process conditions; and computing the process-sensitivity model using the on-target process model and the one or more off-target process models. Note that the system can compute the process-sensitivity model by computing a linear combination of the on-target process model and the one or more off-target process models. Furthermore, note that the semiconductor manufacturing process can include: photolithography, etch, chemical-mechanical polishing (CMP), trench fill, or reticle manufacture.

Another embodiment of the present invention provides a system that determines the dimensions of one or more assist features in an uncorrected or corrected mask layout. During operation, the system receives a set of assist features located in a 2-D region of the mask layout. The system then creates a set of candidate assist feature configurations, which specify the dimensions for one or more assist features in the set of assist features. Next, the system determines an improved assist feature configuration using the set of candidate assist feature configurations and a process model that models one or more semiconductor manufacturing processes. Note that dimensioning assist features in the mask layout based on the improved assist feature configuration improves the manufacturability of the mask layout. Moreover, using the process-sensitivity model to determine the improved assist feature

DETAILED DESCRIPTION

Integrated Circuit Design and Fabrication

Figure 1:
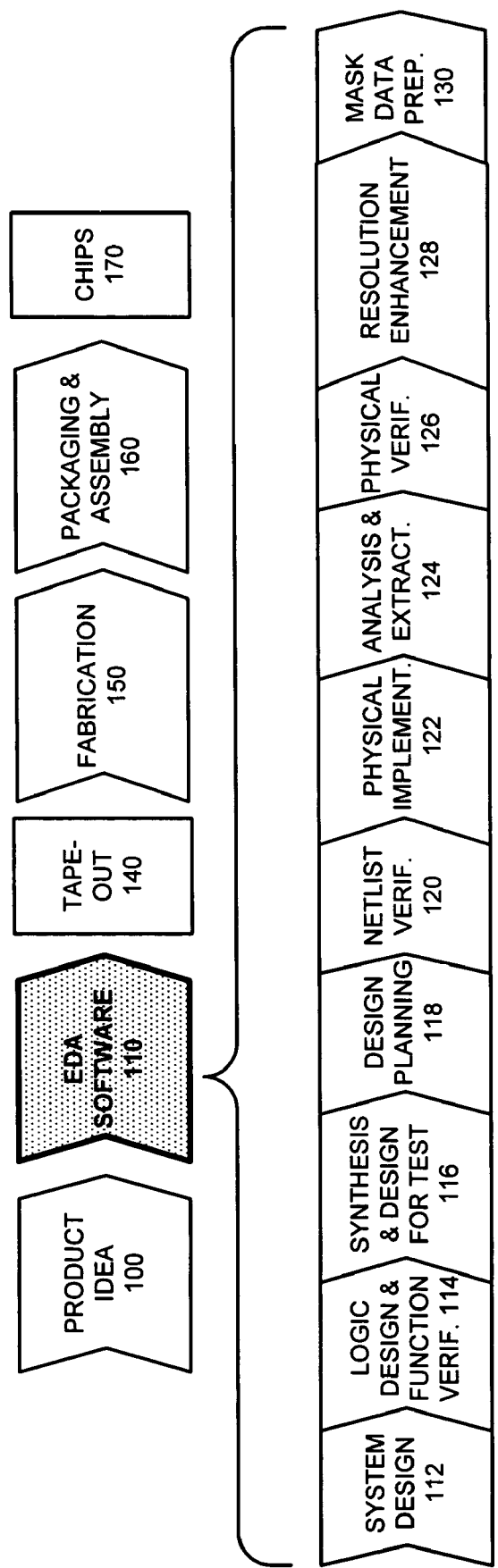
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention. The process starts with a product idea (step 100). Next, the product idea is realized using an integrated circuit, which is designed using Electronic Design Automation (EDA) software (step 110). Once the circuit design is finalized, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), physical verification (step 126), resolution enhancement (step 128), and mask data preparation (step 130).

The present invention can be used during one or more of the above described steps. Specifically, the AFGen® product from Synopsys, Inc. can be suitably modified to determine assist feature placement and/or dimensioning in a mask layout.

Process Variations

Semiconductor manufacturing technologies typically include a number of processes which involve complex physical and chemical interactions. These complex physical and chemical interactions can cause process variations that can cause the characteristics of the actual integrated circuit to be different from the desired characteristics. If this difference is too large, it can lead to manufacturing problems which can reduce the yield and/or reduce the performance of the integrated circuit.

Note that process variations can arise due to a variety of reasons. For example, in photolithography, variations in the rotation speed of the spindle can cause the resist thickness to vary, which can cause variations in the reflectivity, which, in turn, can cause unwanted changes to the pattern's image. Similarly, bake plates—which are used to drive the solvents out of the wafer and form the pattern in photoresist—can have hot or cold spots, which can cause variations in the critical dimension (CD). Likewise, the chuck that holds the wafer during photo exposure can contain microparticles which create "hills" on the wafer's surface that can cause defocusing during lithography. Note that defocusing can also occur because the chuck is out of level, or the lens has aberrations, or the wafer is not completely flat, amongst other reasons.

It is helpful to classify process variations into two types: random and systematic. (Note that the term "depth of focus" is often used as a catch all term to describe the amount of random and systematic process variations.) Random process variations are those process variations that are not presently being modeled using an analytical model. On the other hand, systematic process variations are those process variations that are typically modeled using analytical models. For example, spindle speed variation is typically classified as a random process variation, while pattern corner rounding has been compensated for in a systematic manner. Note that, researchers are continually trying to convert random process variations into systematic process variations by creating new analytical models that model random process variations.

Manufacturing Problems

To be economically viable, a semiconductor manufacturing process has to be robust with respect to process variations, i.e., it must be able to tolerate a large enough range of process variations. Note that improving the robustness (for example, by improving the depth of focus) of a process directly results in cost savings. This is because improving depth of focus reduces the amount of time spent on inspection, servicing, and maintenance of the equipment, thereby increasing the number of wafers that are run. Furthermore, improving the depth of focus can increase the yield. Due to these reasons, increasing depth of focus can substantially increase profits.

Moreover, improving depth of focus becomes even more important as a manufacturing process shifts to smaller dimensions because the inherent depth of focus in these processes becomes rapidly smaller. Specifically, at deep submicron dimensions, even a small improvement in the depth of focus can save millions of dollars in manufacturing costs.

Assist Features

Assist features are often used for improving depth of focus in a mask layout. In particular, sub-resolution assist features (SRAFs) have been especially effective when applied to gate structures and other one-dimensional features. (For the sake of clarity, techniques and systems are described in the context of sub-resolution assist features. But, it will be apparent that these techniques and systems can be readily applied to other kinds of assist features, such as super-resolution assist features. In the remainder of the instant application, unless otherwise stated, the term "assist feature" will refer to a sub-resolution assist feature.)

Figure 2:
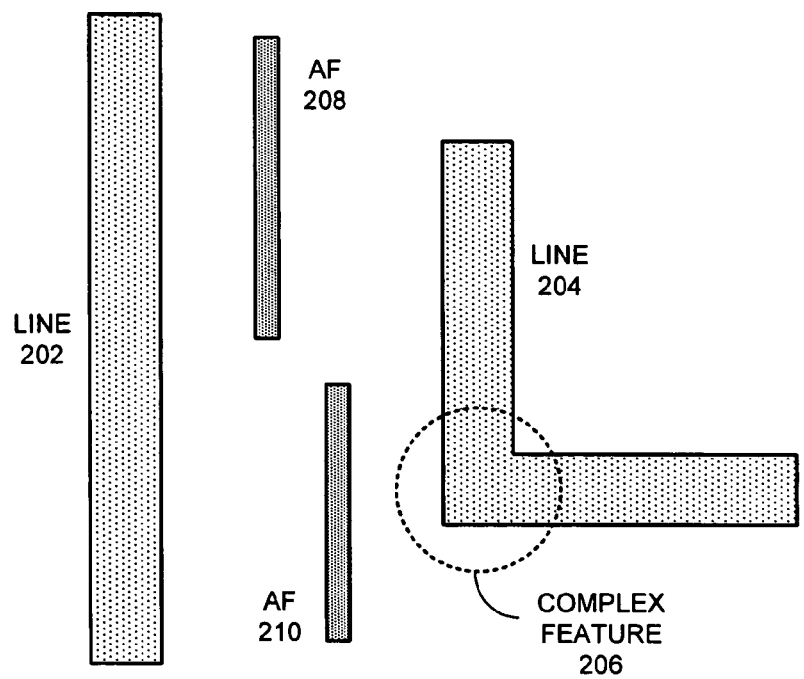
FIG. 2 illustrates assist feature placement and dimensioning in a mask layout in accordance with an embodiment of the present invention.

FIG. 2 illustrates assist feature placement and dimensioning in a mask layout in accordance with an embodiment of the present invention.

Lines 202 and 204 are part of a mask layout. Note that line 204 contains complex feature 206. Assist feature placement and/or dimensioning is more challenging when a layout contains complex features. For example, due to the complex feature 206, we may need to place two assist features 208 and 210 that are staggered, instead of just one assist feature. A layout that has multiple lines with varying pitches is another example of a complex layout.

Present methods for placing assist features typically use process rules that dictate the assist feature placement and dimensioning based on combinations of feature width and spacing parameters.

Figure 3:
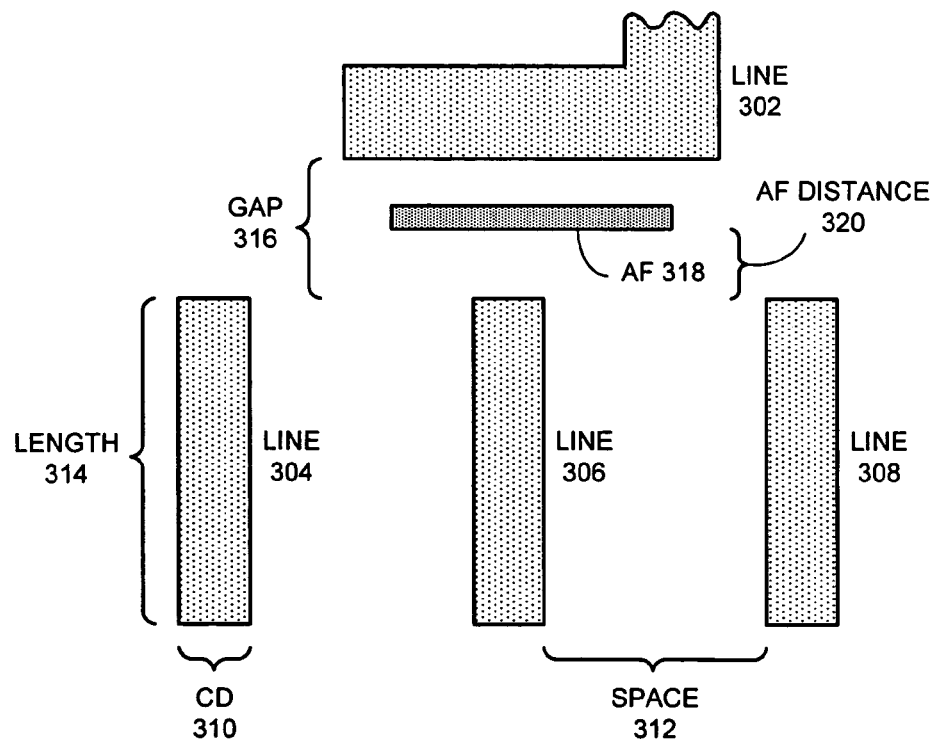
FIG. 3 illustrates assist feature placement and dimensioning using design rules in accordance with an embodiment of the present invention.

FIG. 3 illustrates assist feature placement and dimensioning using process rules in accordance with an embodiment of the present invention.

Lines 302, 304, 306, and 308 are part of a mask layout. In a rule-based approach, assist feature (AF) 318 placement/dimensioning can depend on a variety of factors which are organized in the form of a rule table. For example, the AF distance 320 can be a determined based on a rule table that includes a variety of factors, such as, the critical dimension (CD) 310, space 312, length 314, and gap 316.

Figure 4A:
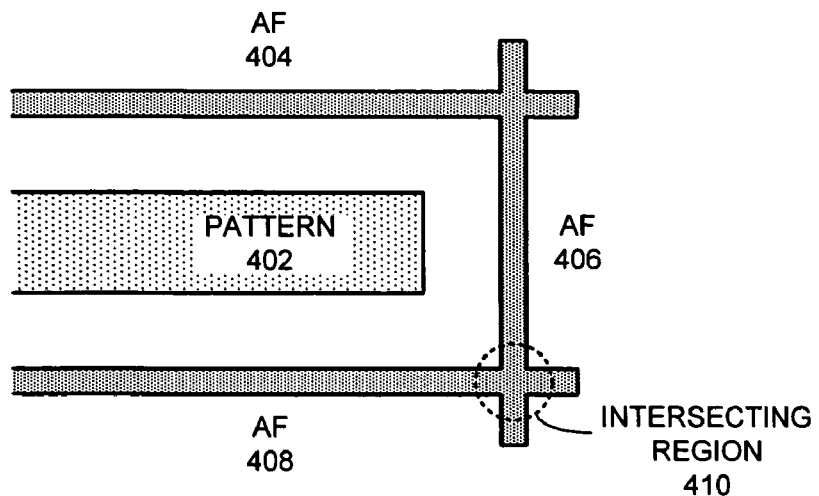
FIG. 4A illustrates how assist features can be placed in a mask layout to improve manufacturability in accordance with an embodiment of the present invention.

FIG. 4A illustrates how assist features can be placed in a mask layout to improve manufacturability in accordance with an embodiment of the present invention.

For example, assist features (AF) 404, 406, and 408 can be placed in a mask layout to improve the manufacturability of pattern 402. Note that intersecting region 410 may print, which is undesirable. That's why rule-based approaches usually cut back assist features to eliminate such intersection regions.

Figure 4B:
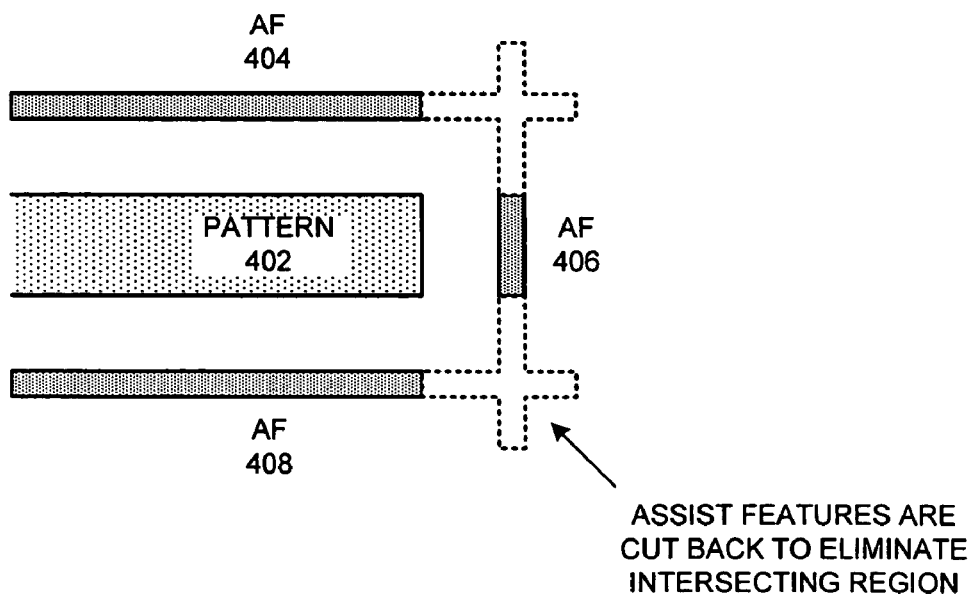
FIG. 4B illustrates how design rules can be used to cut back assist features to eliminate intersecting regions in accordance with an embodiment of the present invention.

FIG. 4B illustrates how design rules can be used to cut back assist features to eliminate intersecting regions in accordance with an embodiment of the present invention.

Unfortunately, placing assist features using process rules can result in missed or sub-optimal placement and/or dimensioning of assist features. Furthermore, for large and complex layouts the rule table can become extremely large and unwieldy.

Process-Sensitivity Model

One of the primary goals of semiconductor manufacturing is to, in one measurement, get all the process variation information at a point on a mask layout. If this can be achieved, one can reduce process variation by appropriately placing assist features, thereby improving the manufacturability of the mask layout. For example, if a designer knows that a line-end is highly sensitive to process variations and is likely to pull back 40 nm during manufacturing, he can use this information to add or adjust an assist feature to fix the manufacturing problem.

Furthermore, it is very important that one identifies these problem areas without using a substantial amount of computation. Note that, problem areas can be identified by simulating various process conditions separately and by comparing the resulting patterns to determine areas that can cause manufacturability problems. Unfortunately, this approach can require a substantial amount of computational time because it involves running multiple complex simulation models.

Instead, what is needed is a process-sensitivity model that can quickly tell us whether an assist feature is going to improve the stability of a structure within a workable process window. (Note that determining whether a structure is stable or not depends on the type of the layer. For example, in a metal layer, significant CD variations may be acceptable as long as they do not cause a short or an open in the circuit. In contrast, in a polysilicon layer, even very small CD variations may be unacceptable.)

In one embodiment, the system can compute the process-sensitivity model by first creating an on-target process model that models a semiconductor manufacturing process under nominal process conditions. Note that the semiconductor processing technology can include photolithography, etch, chemical-mechanical polishing (CMP), trench fill, and/or other technologies and combinations of the foregoing.

Next, the system can create one or more off-target process models that model the semiconductor manufacturing process under one or more process conditions that are different from nominal process conditions.

Specifically, an on-target (or off-target) process model can be represented by a multidimensional function. Moreover, an on-target (or off-target) process model can be approximated using a set of basis functions. Furthermore, in one embodiment, creating an on-target process model involves fitting an analytical model to process data for the semiconductor manufacturing process under nominal process conditions. Likewise, creating the one or more off-target process models can involve fitting an analytical model to process data for the semiconductor manufacturing process under process conditions that are different from nominal process conditions. Additionally, in one embodiment, the one or more off-target process models can be created by analytically perturbing the on-target process model.

Figure 5A:
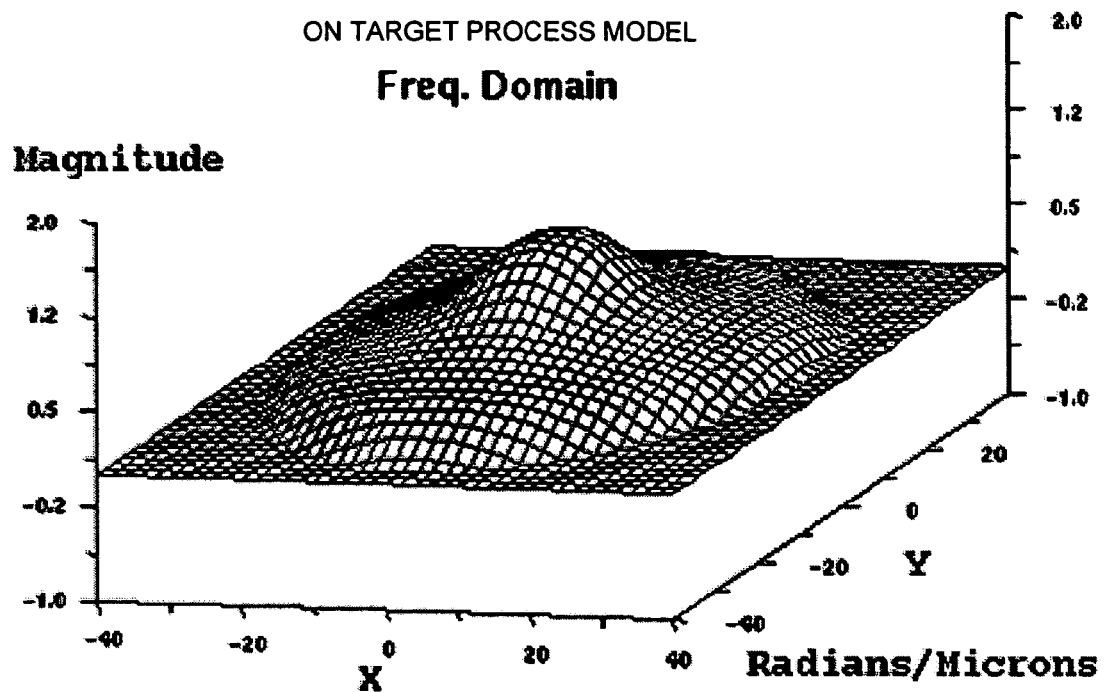
FIG. 5A illustrates a plot of a 2-D function that represents an on-target process model in accordance with an embodiment of the present invention.

FIG. 5A illustrates a plot of a 2-D function that represents an on-target process model in accordance with an embodiment of the present invention.

Figure 5B:
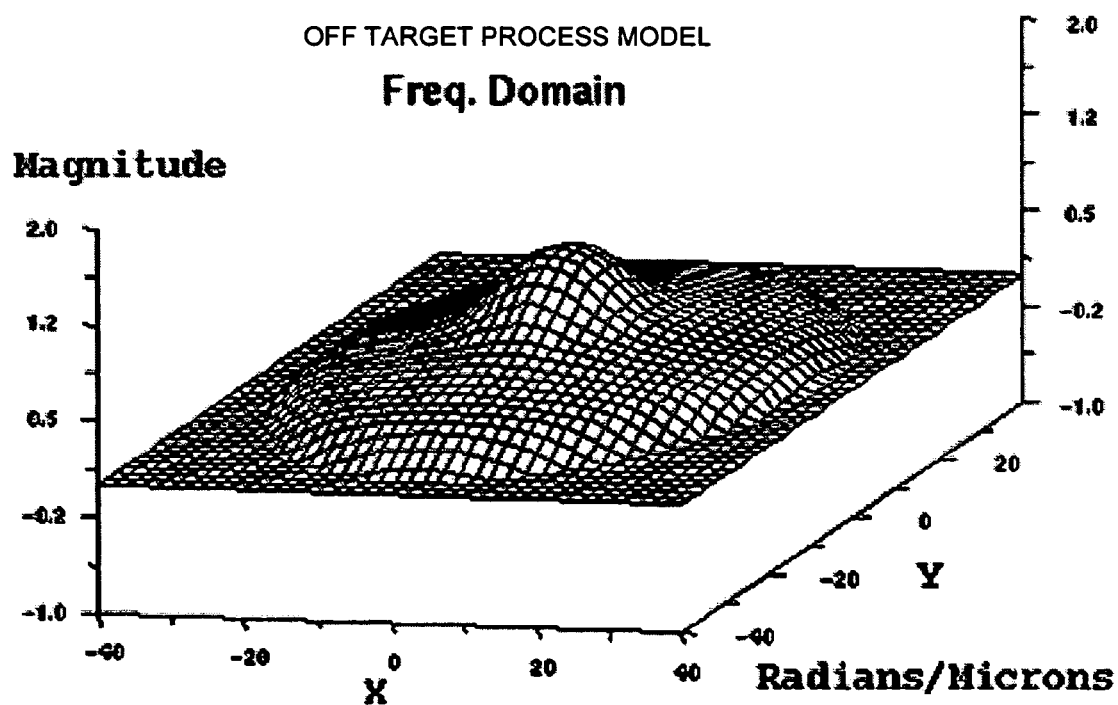
FIG. 5B illustrates a plot of a 2-D function that represents an off-target process model in accordance with an embodiment of the present invention.

FIG. 5B illustrates a plot of a 2-D function that represents an off-target process model in accordance with an embodiment of the present invention.

Figure 5C:
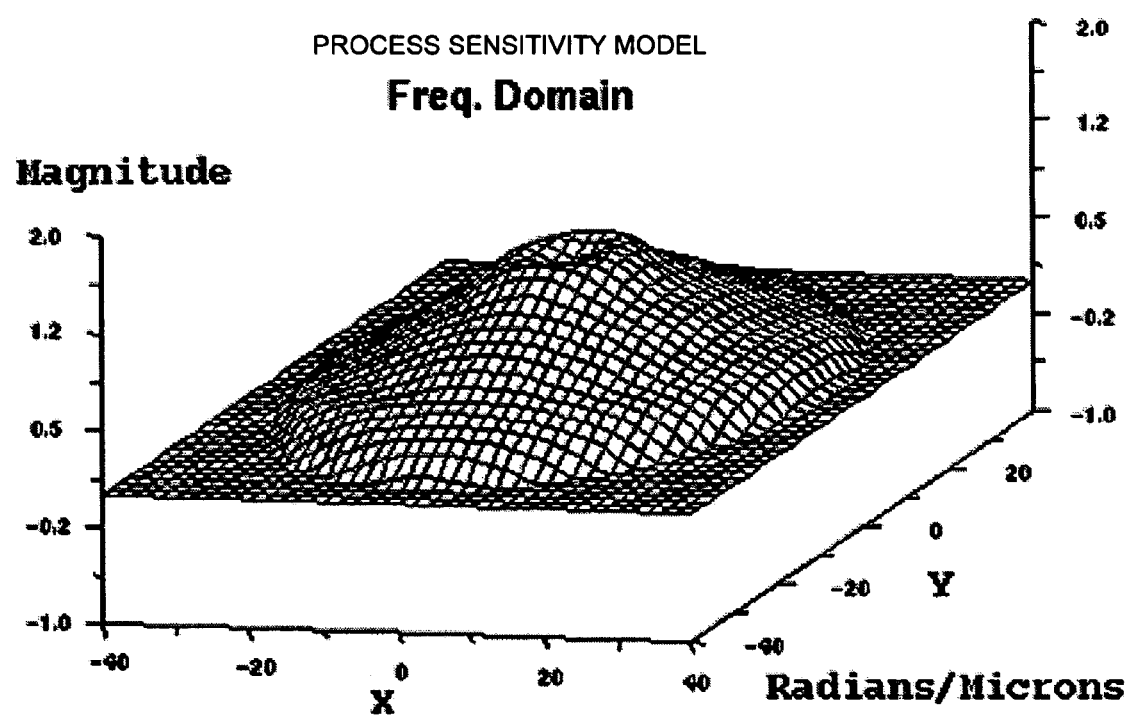
FIG. 5C illustrates a plot of a process-sensitivity model in accordance with an embodiment of the present invention.

FIG. 5C illustrates a plot of a process-sensitivity model in accordance with an embodiment of the present invention.

Note that the 2-D functions illustrated in FIG. 5A and FIG. 5B represent the on-target and the off-target process models, respectively, in the spatial frequency domain. Furthermore, note that, in FIG. 5A, FIG. 5B, and FIG. 5C, the X and Y axes identify a spatial-frequency component (in units of radians per micron), whereas the Z axis indicates the magnitude of a specific spatial-frequency component. These process models can also be represented in other domains, such as the space domain. Additionally, these process models can also be represented in other coordinates, such as polar coordinates.

Specifically, consider the optical lithography case. Let $P_t$ represent an on-target process model, i.e., let $P_t$ model the optical lithography process when it is in focus. Furthermore, let $P_d$ represent an off-target process model, e.g., let $P_d$ model the optical lithography process when it is defocused. Now, the process-sensitivity model, $F_p$, can be computed as follows: $F_p=(P_t-P_d)/\Delta P_d$, where $\Delta P_d$ is the focus offset (in units of length).

Note that in the above example, we only considered a single off-target process model. But, we can have two or more off-target process models. In general, the process-sensitivity model, $F_p$, can be computed as follows:

$$F_p = \frac{1}{n}\left(\frac{1}{\Delta P_1}(P_t - P_1) + \frac{1}{\Delta P_2}(P_t - P_2) + \ldots + \frac{1}{\Delta P_n}(P_t - P_n)\right),$$

where, $P_{1 \ldots n}$ are off-target process models that model arbitrary (e.g., non-optimal) process conditions, $P_t$ is the on-target process model that models a nominal (e.g., optimal) process condition, and $\Delta P_{1 \ldots n}$ are the respective changes in the process conditions between the nominal process condition and the arbitrary (1 ... n) process conditions.

For example, let $P_t$ model the optical lithography process when it is in focus. Furthermore, let $P_{dn}$ model the optical lithography process when it is negatively defocused, i.e., the distance between the lens and the wafer is less than the on-target distance. Additionally, let $P_{dp}$ model the optical lithography process when it is positively defocused, i.e., the distance between the lens and the wafer is larger than the on-target distance. Now, the process-sensitivity model, $F_p$, can be computed as follows:

$$F_p = \frac{1}{2}\left(\frac{(P_0 - P_{dn})}{\Delta P_{dn}} + \frac{(P_0 - P_{dp})}{\Delta P_{dp}}\right),$$

where $\Delta P_{dn}$ and $\Delta P_{dp}$ are the negative and positive focus offsets (in units of length).

Note that, $(P_t-P_{dn})/\Delta P_{dn}$ and $(P_t-P_{dp})/\Delta P_{dp}$ model the pattern features that are lost during negative and positive defocusing, respectively. In the above example, we compute the process-sensitivity model, $F_p$, by adding $(P_t-P_{dn})/\Delta P_{dn}$ and $(P_t-P_{dp})/\Delta P_{dp}$, and by dividing by 2 to normalize the process-sensitivity model. (Note that the process-sensitivity model can also be used without normalization.)

Determining an Improved Assist Feature Configuration

Figure 6:
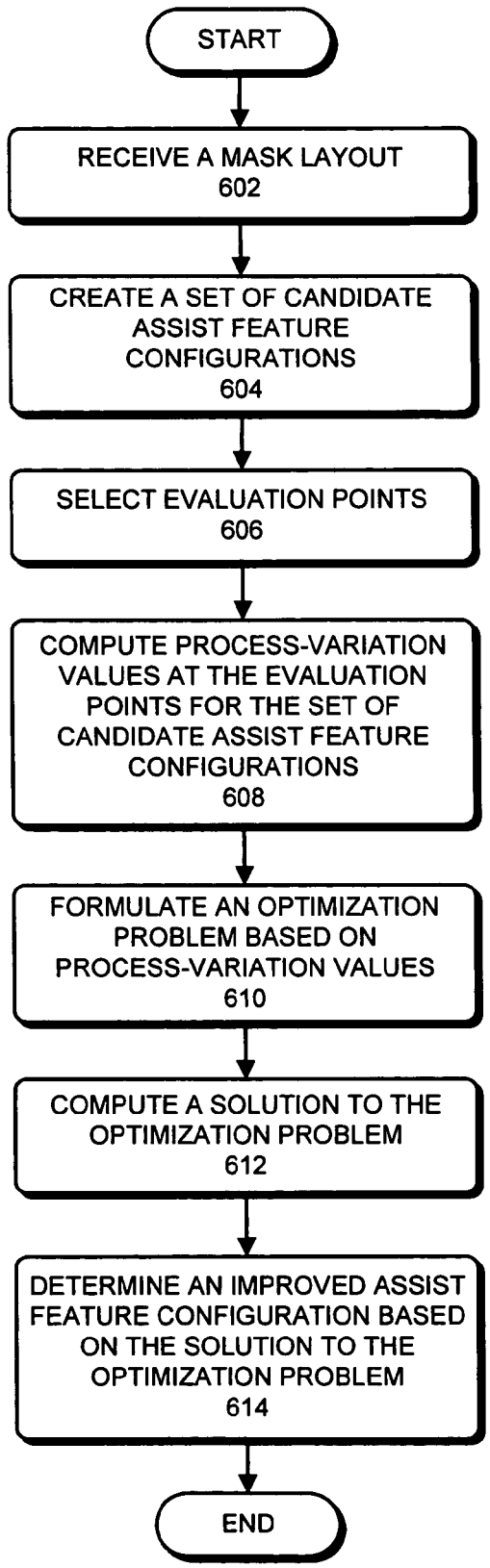
FIG. 6 presents a flowchart that illustrates a process for determining an improved assist feature configuration using a process-sensitivity model in accordance with an embodiment of the present invention.

FIG. 6 presents a flowchart that illustrates a process for determining an improved assist feature configuration using a process-sensitivity model in accordance with an embodiment of the present invention.

The process typically begins by receiving a mask layout (step 602).

Note that one or more resolution-enhancement techniques (RET) can be used to modify a mask layout to improve its manufacturability. We use the term "uncorrected" to denote a mask layout that has not been modified using RETs. On the other hand, we use the term "corrected" to denote a mask layout that has been modified using one or more RETs. Note that, although we typically determine assist feature placement and/or dimensioning in an uncorrected mask layout, these processes and techniques can also be used to determine assist feature placement and/or dimensioning in a corrected mask layout.

The system then creates a set of candidate assist feature configurations (step 604). Note that an assist feature configuration specifies locations and dimensions for one or more assist features in the mask layout.

For example, FIG. 7A, FIG. 7B, FIG. 7C, and FIG. 7D illustrate a set of candidate assist feature configurations in accordance with an embodiment of the present invention.

Figure 7A:
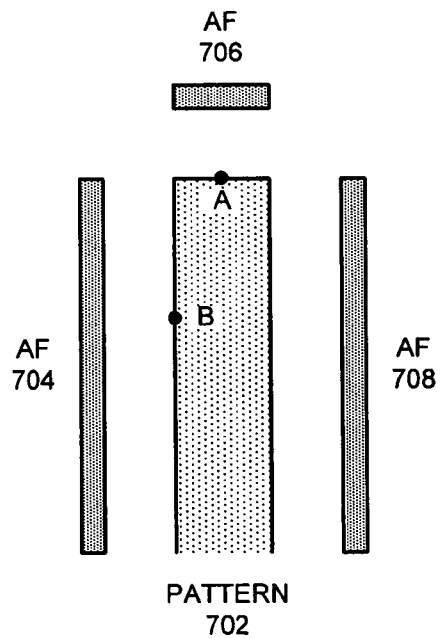
FIG. 7A, FIG. 7B, FIG. 7C, and FIG. 7D illustrate a set of candidate assist feature configurations in accordance with an embodiment of the present invention.
Figure 7B:
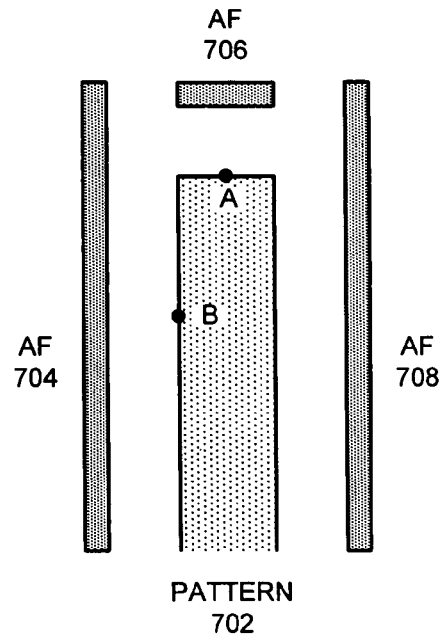
Figure 7C:
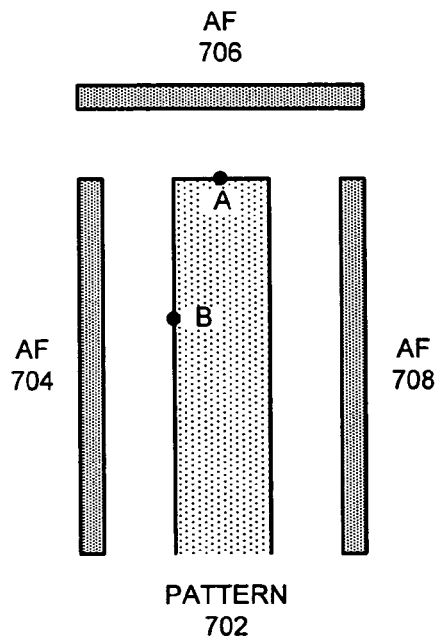
Figure 7D:
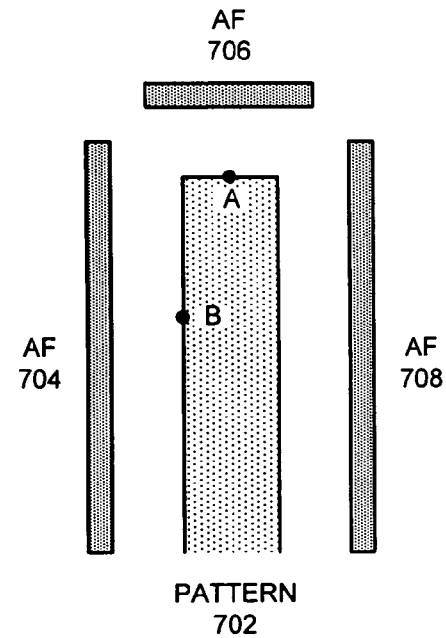

Specifically, the candidate assist feature configuration shown in FIG. 7A specifies the locations and dimensions of assist features 704, 706, and 708. Similarly, FIG. 7B, FIG. 7C, and FIG. 7D illustrate other candidate assist feature configurations that specify different locations and/or dimensions for the assist features.

Next, the system determines an improved assist feature configuration using the set of candidate assist feature configurations and a process-sensitivity model which can be represented by a multidimensional function that captures process-sensitivity information.

Note that placing assist features in the mask layout based on the improved assist feature configuration improves the manufacturability of the mask layout. Furthermore, using the process-sensitivity model to determine the improved assist feature configuration can substantially reduce the computational time required to determine the improved assist feature configuration. This is because the process-sensitivity model can be represented by a single multidimensional function that captures the process-sensitivity information. (Note that, in the absence of such a process-sensitivity model, determining the improved assist feature configuration can involve running multiple complex simulation models that can require a large amount of computation time.)

Furthermore, note that present approaches are primarily directed towards placing assist features to improve through process performance of 1-D regions in a mask layout. Accordingly, these approaches are not directed towards dimensioning assist features to improve through process performance of 2-D regions of a mask layout. In contrast, embodiments of the present invention can specifically be used to substantially improve through process performance of complex 2-D regions in the mask layout.

In particular, the system can determine an improved assist feature configuration using a process model (e.g., an optical intensity model) that models one or more semiconductor manufacturing processes. During operation, the system can receive a set of assist features that are located in a 2-D region of the mask layout. The system can then create a set of assist feature configurations, wherein each assist feature configuration specifies a different set of dimensions for the set of assist features. Next, for each assist feature configuration, the system can compute aerial-image intensities at a number of evaluation points using the process model. The system then uses these intensity values to formulate an optimization problem, wherein a solution to the optimization problem corresponds to a valid assist feature configuration. Next, the system determines a substantially optimal solution to the optimization problem. The system then determines an improved assist feature configuration based on the substantially optimal solution.

Note that many modifications and variations of these techniques and systems will be readily apparent to practitioners skilled in the art. In the following discussion, we describe embodiments that use a process-sensitivity model to determine an improved assist feature configuration. But, it will be apparent that these systems and techniques can be readily modified to use an process model (instead of a process-sensitivity model) to determine substantially optimal assist feature dimensions.

Continuing with the flowchart shown in FIG. 6, the system then determines the improved assist feature configuration by first selecting a set of evaluation points in the mask layout (step 606). For example, the system can select evaluation points A and B as shown in FIG. 7A.

Next, the system can compute process-variation values at the set of evaluation points for the set of candidate assist feature configurations (step 608).

In one embodiment, a process-variation value is computed at each evaluation point for each candidate assist feature configuration.

Specifically, the system places representative assist features in the mask layout based on an assist feature configuration of the set of candidate assist feature configurations. The system then evaluates process-variation values at the set of evaluation points by convolving the process-sensitivity model with a multidimensional function that represents the mask layout (which contains the representative assist features).

For example, the system can first place representative assist features based on the candidate assist feature configuration shown in FIG. 7A. Next, the system can compute the process-variation values at evaluation points A and B by convolving the process-sensitivity model with a multidimensional function that represents the mask layout (which contains the representative assist features). The system can then compute process-variation values at evaluation points A and B for the other candidate assist feature configurations shown in FIG. 7B, FIG. 7C, and FIG. 7D. Hence, in this example, the system computes four process-variation values (one for each candidate assist feature configuration) at each evaluation point.

Note that the system can store the process-variation values in a database. This allows the system to retrieve the process-variation value at a location in the mask layout by querying the database, instead of re-computing the process-variation value.

The system then formulates an optimization problem based on the process-variation values (step 610). Note that the optimization problem is formulated in such a way that a solution to the optimization problem is associated with an improved assist feature configuration. In one embodiment, the objective function for the optimization problem is a linear combination of variables associated with the process-variation values at the evaluation points.

Note that the system can formulate the optimization problem using a number of techniques. For example, the system can formulate the optimization problem as a linear programming problem. Specifically, the length of the assist features and the process variation values at the evaluation points can be associated with variables in the linear programming formulation. Furthermore, the objective function can be the sum of the variables associated with the process variation values.

For example, in FIG. 7A, the process-variation value at evaluation points A and B, can be approximated by a linear combination of the assist feature lengths as follows:

$$V^A = c_1^A \cdot l_1 + c_2^A \cdot l_2 + c_3^A$$

$$V^B = c_1^B \cdot l_1 + c_2^B \cdot l_2 + c_3^B$$

where, $V^A$ and $V^B$ are the process-variation values at evaluation points A and B, respectively, $c_1^A$, $c_2^A$, $c_3^A$, $c_1^B$, $c_2^B$, and $c_3^B$ are coefficients, and $l_1$, $l_2$, and $l_3$ are the lengths of assist features 704, 706, and 708, respectively.

Furthermore, the sum of the process-variation values, $V^A + V^B$, can be used as the objective function. Moreover, a number of constraints can be specified for the assist feature lengths as follows:

$$low_1 \leq l_1 \leq high_1$$

$$low_2 \leq l_2 \leq high_2$$

$$low_3 \leq l_3 \leq high_3,$$

where, $low_j$ and $high_j$ are the lower and upper bounds, respectively, for the length of the assist feature j.

In one embodiment, the coefficients, $c_1^A$, $c_2^A$, and $c_3^A$ can be computed by solving the following system of linear equations:

$$\begin{bmatrix} l_{11} & l_{12} & l_{13} \\ l_{21} & l_{22} & l_{23} \\ l_{31} & l_{32} & l_{33} \end{bmatrix} \cdot \begin{bmatrix} c_1^A \\ c_2^A \\ c_3^A \end{bmatrix} = \begin{bmatrix} V_1^A \\ V_2^A \\ V_3^A \end{bmatrix},$$

where, $l_{ij}$ is the length ($l_j$) of assist feature j in configuration i, and $V_i^A$ is the process-variation value at evaluation point A for configuration i. Similarly, we can also compute the coefficients $c_1^B$, $c_2^B$, and $c_3^B$ by solving a similar system of linear equations.

In another embodiment, the optimization problem can be formulated as follows:

Minimize: $g(V_1, V_2, \ldots V_m)$

Constraints:

$$V_1 = f_1(l_1, l_2, \ldots, l_n)$$

$$V_2 = f_2(l_1, l_2, \ldots, l_n)$$

$$\vdots$$

$$V_m = f_m(l_1, l_2, \cdots, l_n)$$

$$low_1 \leq l_1 \leq high_1$$

$$low_2 \leq l_2 \leq high_2$$

$$\vdots$$

$$low_n \leq l_n \leq high_n,$$

where, g is the objective function, $V_i$ is the process-variation value at evaluation point i, $l_1, l_2, \ldots, l_n$ are assist feature configuration variables that specify the locations and dimensions of assist features, $f_i$ is a function of the assist feature configuration variables that approximates the process-variation value at evaluation point i, and $low_j$ and $high_j$ are the lower and upper bounds, respectively, for the assist feature configuration variable $l_j$. Note that functions $f_1, f_2, \ldots, f_m$ can be determined using a variety of curve fitting techniques.

Additionally, to reduce computational time, the system can divide the mask layout into multiple regions and formulate a separate optimization problem for each region.

Figure 8:
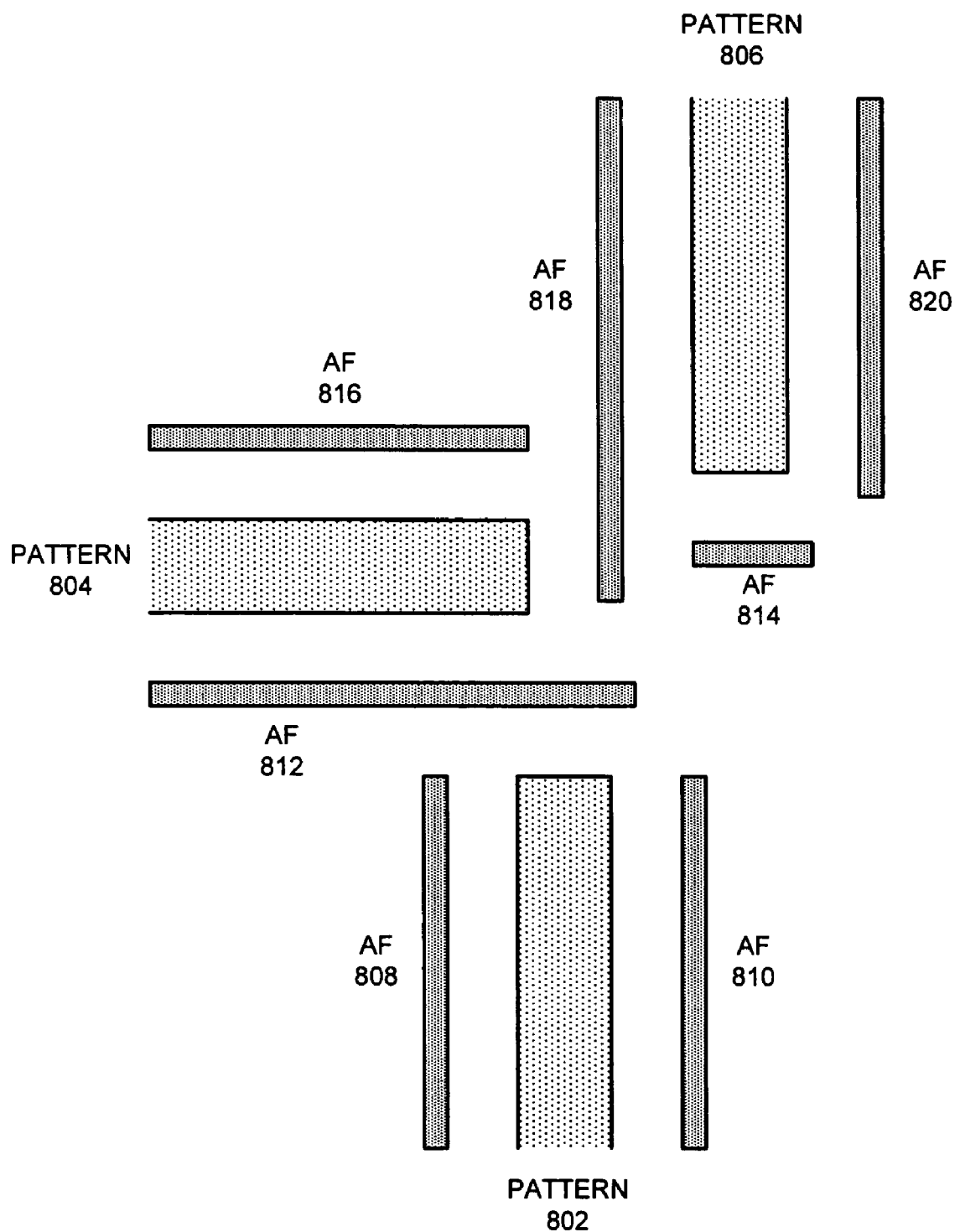
FIG. 8 illustrates how a mask layout can be divided into multiple regions so that a separate optimization problem can be formulated for each region in accordance with an embodiment of the present invention.

FIG. 8 illustrates how a mask layout can be divided into multiple regions so that a separate optimization problem can be formulated for each region in accordance with an embodiment of the present invention. (Note that, for the sake of clarity, we do not show the evaluation points in FIG. 8.)

Assist features 808, 810, 812, 814, 816, 818, and 820 are placed in the mask layout to help improve the manufacturability of patterns 802, 804, and 806. In one embodiment, the system can divide the mask layout shown in FIG. 8 into three regions: a first region containing assist features 808, 810, and 812, a second region containing assist features 812, 814, and 816, and a third region containing assist features 814, 818, and 820. The system can then formulate a separate optimization problem for each of these three regions. Note that, if an assist feature is common to multiple regions, the assist feature's location and dimension can be determined based on the values of the assist feature configuration variables which were determined by solving the multiple optimization problems. In another embodiment, the system can determine the assist feature's location and dimension based on solving one of the optimization problems, and ignore the locations and dimensions for the assist feature that were determined by solving the optimization problems for the other regions.

Next, the system computes a substantially optimal solution to the optimization problem (step 612).

The system then determines the improved assist feature configuration based on the substantially optimal solution to the optimization problem (step 614). Note that a solution to the optimization problem determines values for the assist feature configuration variables, which, in turn, determine the locations and dimensions of the assist features in the mask layout.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art.

For example, embodiments of the present invention can be used to determine assist feature placement in mask layouts for manufacturing micro-electro-mechanical systems (MEMS).

Additionally, the above disclosure is not intended to limit the present invention. The scope of the present invention is defined by the appended claims.

What is claimed is:

1. A method for determining an assist feature configuration which specifies locations and dimensions for one or more assist features in a mask layout, the method comprising:
    receiving the mask layout;
    creating a set of candidate assist feature configurations;
    selecting a set of evaluation points in the mask layout;
    determining process-variation values at the set of evaluation points for the set of candidate assist feature configurations, wherein convolving the mask layout with the process-sensitivity model at an evaluation point in the mask layout generates a value that is indicative of the mask layout's sensitivity to process variations at the evaluation point,
    wherein determining the process-variation values includes:
    placing representative assist features in the mask layout based on a candidate assist feature configuration in the set of candidate assist feature configurations;
    evaluating process-variation values at the set of evaluation points by convolving the process-sensitivity model with the mask layout; and
    determining an improved assist feature configuration using the process-variation values,
    wherein determining the improved assist feature configuration using the process-variation values includes:
    formulating an optimization problem based on the process-variation values, wherein a solution to the optimization problem is associated with an assist feature configuration;
    computing a substantially optimal solution to the optimization problem; and
    determining the improved assist feature configuration based on the substantially optimal solution to the optimization problem;
    wherein placing assist features in the mask layout based on the improved assist feature configuration improves the mask layout's manufacturability;
    wherein using the process-sensitivity model to determine the improved assist feature configuration reduces an amount of computational time required to determine the improved assist feature configuration.

2. The method of claim 1, wherein the optimization problem uses an objective function which is a linear combination of variables associated with the process-variation values at the evaluation points.

3. The method of claim 1, wherein the process-sensitivity model is computed by:
    creating an on-target process model that models a semiconductor manufacturing process under nominal process conditions;
    creating one or more off-target process models that model the semiconductor manufacturing process under one or more process conditions that are different from nominal process conditions; and
    computing the process-sensitivity model using the on-target process model and the one or more off-target process models.

4. The method of claim 3, wherein computing the process-sensitivity model involves computing a linear combination of the on-target process model and the one or more off-target process models.

5. The method of claim 3, wherein the semiconductor manufacturing process includes one of:
    photolithography;
    etch;
    chemical-mechanical polishing (CMP);
    trench fill; or
    reticle manufacture.

6. The method of claim 1, wherein the mask layout can be an uncorrected or corrected mask layout.

7. A computer-readable storage device storing instructions that when executed by a computer cause the computer to perform a method for determining an assist feature configuration which specifies locations and dimensions for one or more assist features in a mask layout, the method comprising:
    receiving the mask layout;
    creating a set of candidate assist feature configurations;
    selecting a set of evaluation points in the mask layout;
    determining process-variation values at the set of evaluation points for the set of candidate assist feature configurations, wherein convolving the mask layout with the process-sensitivity model at an evaluation point in the mask layout generates a value that is indicative of the mask layout's sensitivity to process variations at the evaluation point,
    wherein determining the process-variation values includes:
    placing representative assist features in the mask layout based on a candidate assist feature configuration in the set of candidate assist feature configurations;

evaluating process-variation values at the set of evaluation points by convolving the process-sensitivity model with the mask layout; and determining an improved assist feature configuration using the process-variation values, wherein determining the improved assist feature configuration using the process-variation values includes:

formulating an optimization problem based on the process-variation values, wherein a solution to the optimization problem is associated with an assist feature configuration;

computing a substantially optimal solution to the optimization problem; and determining the improved assist feature configuration based on the substantially optimal solution to the optimization problem;

wherein placing assist features in the mask layout based on the improved assist feature configuration improves the mask layout's manufacturability;

wherein using the process-sensitivity model to determine the improved assist feature configuration reduces an amount of computational time required to determine the improved assist feature configuration.

8. The computer-readable storage device of claim 7, wherein the optimization problem uses an objective function which is a linear combination of variables associated with the process-variation values at the evaluation points.

9. The computer-readable storage device of claim 7, wherein the process-sensitivity model is computed by:

creating an on-target process model that models a semiconductor manufacturing process under nominal process conditions;

creating one or more off-target process models that model the semiconductor manufacturing process under one or more process conditions that are different from nominal process conditions; and computing the process-sensitivity model using the on-target process model and the one or more off-target process models.

10. The computer-readable storage device of claim 9, wherein computing the process-sensitivity model involves computing a linear combination of the on-target process model and the one or more off-target process models.

11. The computer-readable storage device of claim 9, wherein the semiconductor manufacturing process includes one of:

photolithography;
etch;
chemical-mechanical polishing (CMP);
trench fill; or
reticle manufacture.

12. The computer-readable storage device of claim 7, wherein the mask layout can be an uncorrected or corrected mask layout.

* * * * *